United States Patent

Kurohata et al.

[11] 4,052,956
[45] Oct. 11, 1977

[54] CHANNEL INDICATOR

[75] Inventors: Hitoshi Kurohata; Jun Kawai; Nobuyoshi Hizuka, all of Aichi, Japan

[73] Assignee: Matsushita Electric Industrial Co., Ltd., Japan

[21] Appl. No.: 692,048

[22] Filed: June 2, 1976

[30] Foreign Application Priority Data

June 11, 1975 Japan .................................. 50-71116

[51] Int. Cl.² .......................................... H03J 1/08
[52] U.S. Cl. ................................. 116/124.1 A; 40/95
[58] Field of Search ............... 116/124.1 A, DIG. 31, 116/124 R; 242/71.2; 40/95, 86 R

[56] References Cited

U.S. PATENT DOCUMENTS 1,150,314  8/1915  Stephens ........................... 40/95
2,530,191  11/1950  Clouez ............................. 40/95

FOREIGN PATENT DOCUMENTS 437,237  10/1935  United Kingdom ......... 116/124.1 A

Primary Examiner—S. Clement Swisher
Assistant Examiner—Denis E. Corr
Attorney, Agent, or Firm—Cushman, Darby & Cushman

[57] ABSTRACT

A channel indicator for a television set etc. which comprises a thin film tape, on which tape the numbers of channels are printed, and a tape-advancing means which is linked to a tuner so that the tape is advanced to indicate the number of the channel that is selected by the tuner. The indicator also comprises a fine adjusting means for adjusting the tape so that the numbers of channels are placed appropriately in an indication window.

3 Claims, 11 Drawing Figures

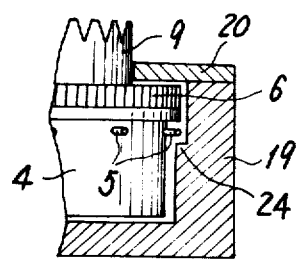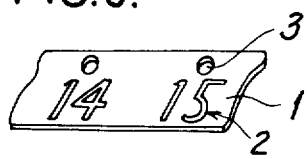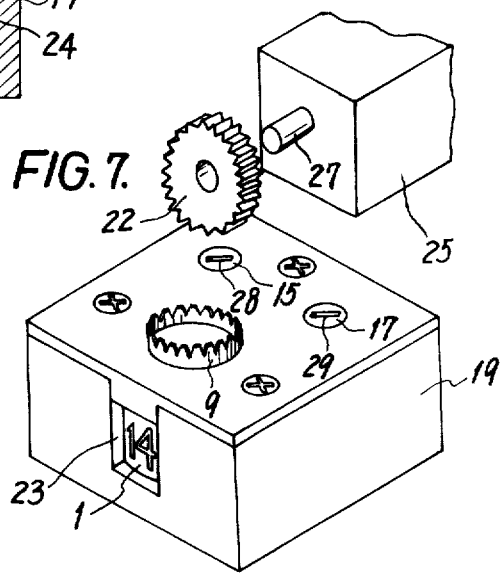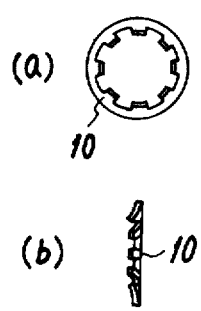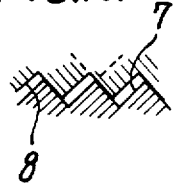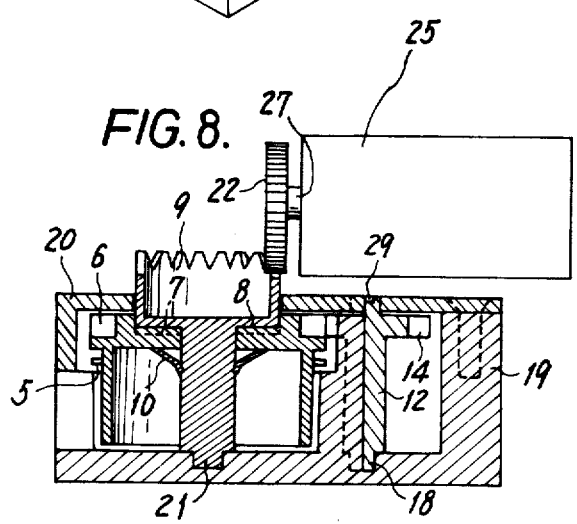

CHANNEL INDICATOR

BACKGROUND OF THE INVENTION

This invention relates to a channel indicator for a television set etc. comprising a thin film tape, on which tape channel numbers are printed.

In a television set comprising a UHF tuner, it is necessary to indicate the channel numbers in two-digit figures. In conventional television sets carrying such UHF tuner, channel indication has been made by utilizing two discs or two rings with numbers thereon for indicating the first digit figures and the second digit figures. However, such system is likely to have a fault that the first digit figure and the second digit figure in a window will not fall onto the same line but are put on different levels or that a slit or gap is observed between the two discs or rings.

SUMMARY OF THE INVENTION

The present invention provides a novel television channel indicator which comprises a thin film tape provided with channel numbers printed thereon and eliminates the abovementioned shortcoming. Also the channel indicator of the present invention is capable of fine adjustment of the position of indicating figures in relation to an indicating window.

BRIEF DESCRIPTION OF THE DRAWING

FIG. 1 to FIG. 10 illustrate a channel indicator embodying the present invention, wherein:

FIG. 1 is a fragmentary perspective view,

FIG. 2 is a perspective view of the assembled channel indicator,

FIG. 3 is a schematic planview showing how a thin film tape 1 is wound around a sprocket drum 4 and reels 11 and 12, FIG. 4 is a schematic planview showing engagement between a ring gear 6 and reel gears 13 & 14, FIG. 5 is a sectional elevation view showing the relation between a part of a sprocket drum 4, the thin film tape 1 and a housing 19, FIG. 6 is a perspective view of a part of the thin film tape 1, FIG. 7 is a fragmentary perspective view of the channel indicator shown with a driving gear 22 and a channel selector 25, FIG. 8 is a sectional elevation view by sectional plane shown by A-B-C-D in FIG. 4, showing an assembly of the channel indicator, the driving gear 22 and the channel selector 25, FIG. 9(a) and (b) are planview and side view, respectively of a spring washer used in the channel indicator, and FIG. 10 is an enlarged schematic sectional view of radial notches 7 and 8 in engagement with each other.

DETAILED DESCRIPTION OF THE PRESENT INVENTION

One preferred example of the present invention is elucidated referring to FIGS 1 to 10.

Figure 1:
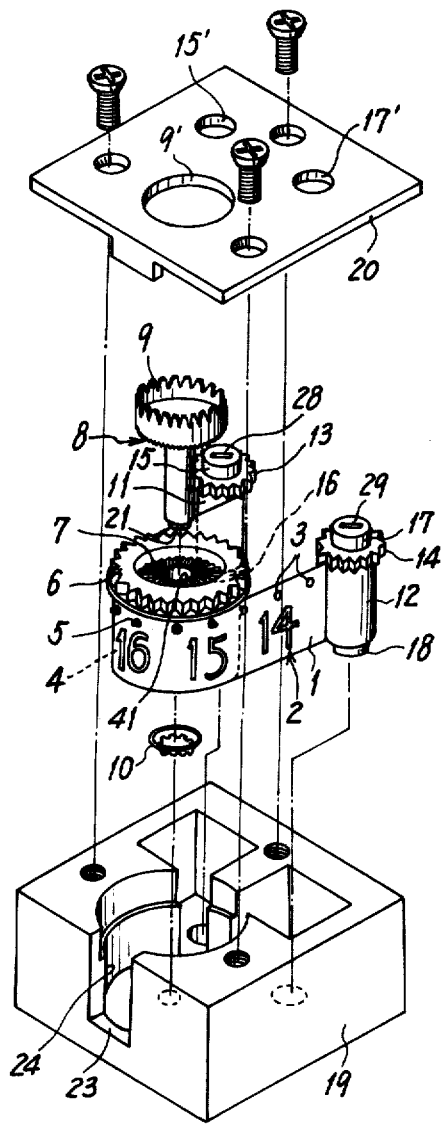
Figure 2:
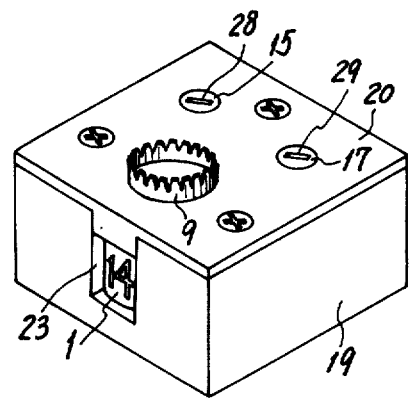
Figure 3:
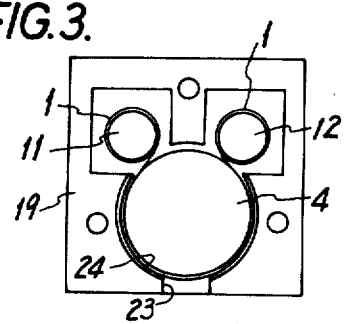
Figure 4:
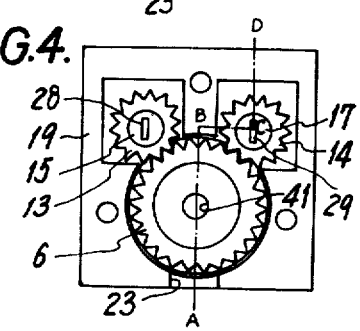

As shown in FIG. 1, a thin film tape 1 having channel numbers 2 printed thereon is wound around a part of the sprocket drum 4 so that pins 5 which are formed at uniform distances on an edge of the drum engage with holes 3 which are at uniform distances on an edge of the thin film tape 1. Radial notches 7 are formed on the top face of the sprocket drum 4 and similar radial notches 8 for engaging with the radial notches 7 are formed on the bottom face of a crown gear 9 which is to be placed coaxially with the sprocket drum 4. A sprng member 10, for instance a spring washer, for pushing the sprocket drum 4 upward so as to engage the radial notches 7 and 8 with each other, is disposed under the sprocket drum 4.

Both ends of the thin film tape 1 are fixed to reels 11 and 12, respectively. Gears 13 and 14 are fixed to the top part of the reels 11 and 12, respectively. The gears 13 and 14 are disposed to engage with a ring gear 6 which is fixed to the top face of the sprocket drum 4.

The abovementioned parts are enclosed in a housing 19 having a lid plate 20. In the housing 19, the sprocket drum 4 and the reels 11 and 12 are encased in a manner to be able to rotate around their shafts 21, 16 and 18, respectively. The crown gear 9 is disposed on the shaft 21 of the sprocket drum 4, the shaft 21 being inserted in the bearing hole 41 of the latter. The crown gear 9 is also rotatably received by the bearing hole 9' of the lid 20. Upper shafts 15 and 17 of the reels 11 and 12 are also rotatably received by the bearing holes 15' and 17' of the lid, respectively. Thus, in the abovementioned assembly, by means of the spring washer 10, the sprocket drum 4 is pushed upward to the crown gear 9, and accordingly, the radial notches 7 and 8 abut each other thereby to engage and transmit the rotation of the crown gear 9 to the sprocket drum 4.

A driving gear 22 connected to a shaft 27 of a channel selector 25 is disposed so as to engage with the crown gear 9 so that shaft 27 of the driving gear 22 extends at aangle to the shaft 21 of the crown gear.

When the shaft 27 of the channel selector 25 is driven by means of known automatic channel selection mechanism in the channel selector 25 or by means of manual operation of a channel selecting knob of a channel selector 25, the driving gear 22 is driven and accordingly the crown gear 9 and the sprocket drum 4 are driven. Then, gears 13 and 14 are also driven on account of engagement with the gear 6 which is fixed to the sprocket drum 4. Thus the thin film tape 1 wound out from one of the reels, is driven by pin 5 and is wound onto the other one of the reels. Therefore, the channel number indicated on the thin film tape 1 is changed corresponding to the selected channel.

In the housing 19, a detent or a corner 24 is provided so as to prevent the thin film tape 1 becoming free from the pins 5, as shown in FIG. 5.

The reason to use a thin film tape 1 instead of a thick and hard film tape is that the thin film tape does not show undesirable excessive hardness or resilient force which would result in a considerable expansion in outer diameter of the rolled film tape wound around the reel 13 or 14 and would thereby cause undesirable scratching of the surface of the film tape by the inside wall of the housing 19. By adopting the thin film tape, the diameters of the rolled tape wound around the reels do not expand unnecessarily, and therefore, the tape is free from scratching damage as well as unnecessary friction and is driven smoothly with a small torque force. Preferable thickness of plastic thin film tape is less than 0.15 mm.

In order to prevent cracking of the thin film tape at a corner of the holes 3 the shape of the holes 3, as well as of the section of the pins 5, are selected to be curved, for instance, circles or ellipses.

The gear ratio of the ring gear 6 and the reel gears 13 and 14 are selected to correspond to the ratio of the diameters of the sprocket drum 4 and the reels 11 and 12, so that the thin film tape 1 is wound out from and wound onto the reel without becoming unnecessarily loose or tight.

Slits 28 and 29 for receiving the tip of a screw driver are formed on the top faces of the shafts 15 and 17 of the reel 11 and 12, respectively. Accordingly, by inserting the tip of a screw driver into one of the slits 28 or 29 and rotating the shaft 15 or 17, the thin film tape 1 can be adjusted to an appropriate position in relation with the window 23 of the housing. Adjusting of the thin film tape 1 to a proper position is made by first adjusting the channel selector 25 appropriately at a desired channel, fixing it at this state, and then adjusting the shaft 15 or 17 in a manner that the channel number corresponding to the selected channel is indicated at the proper position in the window 23. When the slit 28 or 29 is rotated by a screw driver, then apart from the crown gear 9, the sprocket drum 4 rotates by means of engagements of the reel gears 13 & 14 and the ring gear 6, while overcoming an engagement between the radial notches 7 and 8 rendered by a pressing force between the radial notches 7 and 8 imparted by the spring washer 10. Thus the adjustment of the thin film tape can be made freely by temporarily making a slip between the radial notches 7 and 8 as shown by an arrow in FIG. 10. Since the radial notch can be made very fine, the adjustment of the figures of the channel number in relation to the window 23 can be made precisely.

As is described in the above, according to the present invention, as a result of use of thin film tape undesirable resilient force of the tape is negligibly small, and accordingly there is no fear of the tape contacting inner wall of the housing hence causing undesirable friction and scratches, and therefore durable clear indication in the window as well as smooth motion of the tape with a small torque force is assured. Furthermore, by means of the radial notches engagement, fine adjustment of the position of the figures in the window is obtainable.

What is claimed is:
1. A channel indicator comprising:
    a thin film tape having channel numbers printed thereon;
    a sprocket drum for advancing said thin film tape by its rotation;
    a pair of reels to which both ends of said thin film tape are fixed, respectively;
    a linking means for rotating said reels in response to the rotation of said sprocket drum;
    a housing which encases the above-mentioned elements and has a window for indicating said channel number on the thin film tape therefrom;
    a channel selector, a shaft of which has tuning means, the tuning frequency of which is controlled by revolving said shaft;
    a gear means linked to said shaft; and
    an adjustable engaging means including a pair of engaging members both having radial notches on engaging faces, respectively, and a spring means which pushes said engaging members toward each other so that said radial notches on said engaging faces are pressed to each other with a specified force thereby engaging said pair of engaging members, said engaging means rotatably linking said gear means and said sprocket drum.
2. A channel indicator as in claim 1, wherein said thin film tape is less than 0.15 mm thick so that the thin film tape has no resilient force which expands the outer diameter of said thin film tape wound around said reels.
3. A channel indicator as in claim 1, wherein said sprocket drum has engaging pins of round section around drum face and said thin film tape has round engaging holes for receiving said pins.

* * * * *